(12) United States Patent
Chu (10) Patent No.: US 7,652,296 B2
(45) Date of Patent: Jan. 26, 2010

(54) LIGHT EMITTING DEVICE WITH HIGH LIGHT EXTRACTION EFFICIENCY

(75) Inventor: Yuan-Fa Chu, Chu-Nan (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 0 days.

(21) Appl. No.: 12/080,637

(22) Filed: Apr. 2, 2008

(65) Prior Publication Data

US 2008/0296603 A1  Dec. 4, 2008

(30) Foreign Application Priority Data

Jun. 4, 2007  (CN) .................. 2007 1 0200755

(51) Int. Cl.
H01L 27/15 (2006.01)
H01L 31/12 (2006.01)
H01L 33/00 (2006.01)

(52) U.S. Cl. .................. 257/79; 257/99; 257/E33.064

(58) Field of Classification Search .................. 257/13, 257/79–103, E33.064
See application file for complete search history.

(56) References Cited

U.S. PATENT DOCUMENTS 7,288,797 B2 * 10/2007 Deguchi et al. .............. 257/99

FOREIGN PATENT DOCUMENTS

CN  1601776 A  3/2005
CN  1630110 A  5/2005

* cited by examiner

Primary Examiner—Thien F Tran
(74) Attorney, Agent, or Firm—Clifford O. Chi (57) ABSTRACT

An exemplary solid-state light emitting device includes a substrate, a light emitting structure, a first electrode and a second electrode have opposite polarities with each other. The light emitting structure is formed on the substrate and includes a first-type semiconductor layer and a second-type semiconductor layer. The first electrode is electrically connected with the first-type semiconductor layer. The second electrode includes a transparent conductive layer formed on the second-type semiconductor layer and a metallic conductive layer formed on a region of the transparent conductive layer and in electrical contact therewith. Any point on the region is no more than 300 micrometers from a nearest part of the metallic conductive layer, and an exposed portion uncovered by the metallic conductive layer of the region has an area of at least 80% of a total area of the transparent conductive layer.

14 Claims, 14 Drawing Sheets

LIGHT EMITTING DEVICE WITH HIGH LIGHT EXTRACTION EFFICIENCY

BACKGROUND

1. Technical Field

The present invention generally relates to light emitting devices and, particularly, to a solid-state light emitting device with high light extraction efficiency.

2. Description of Related Art

Figure 1:
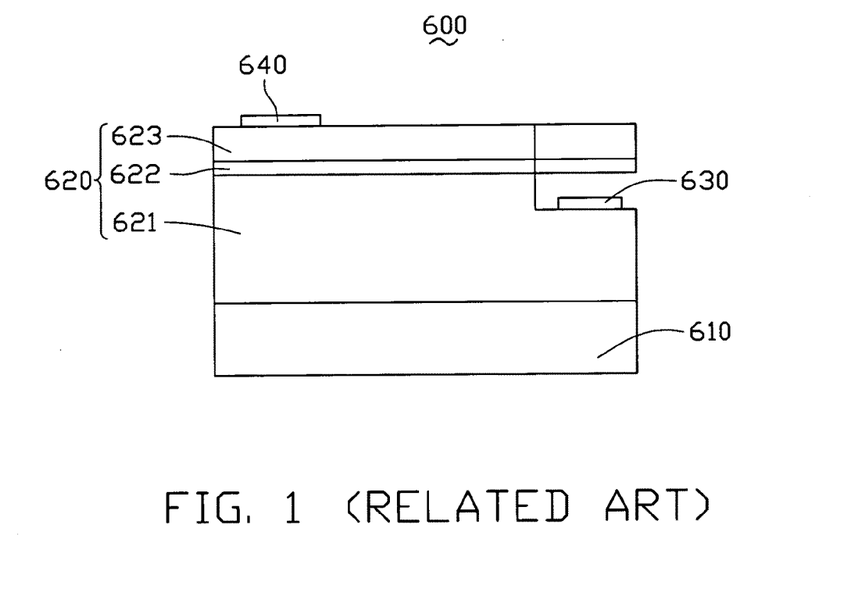
FIG. 1 is a schematic, front view of a typical light emitting diode.
Figure 2:
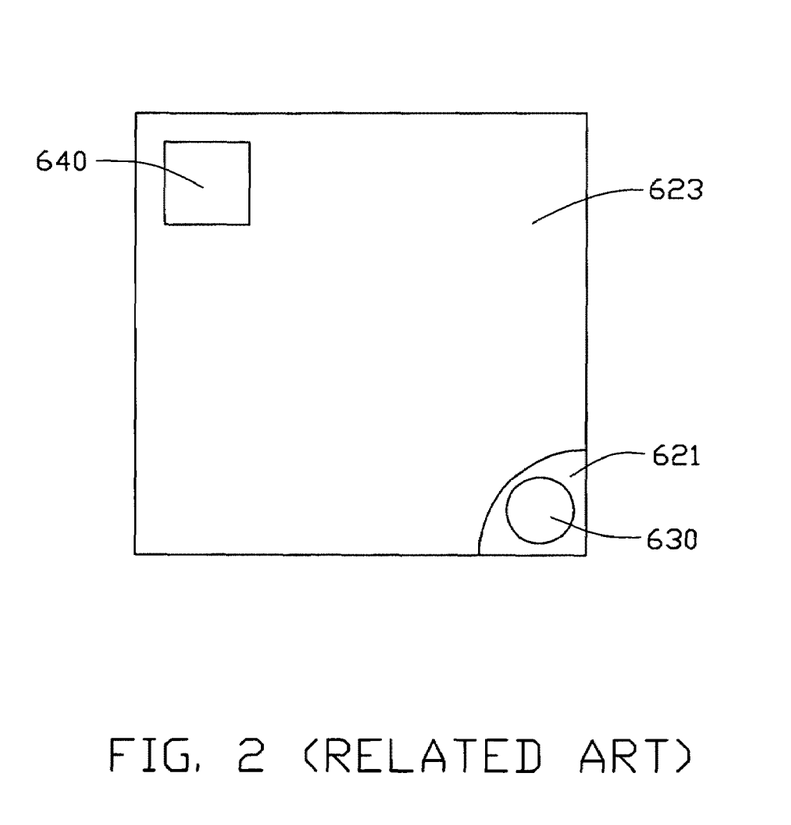
FIG. 2 is a schematic, top view of the light emitting diode of FIG. 1.

Referring to FIGS. 1 and 2, a typical solid-state light emitting device, e.g., a semiconductor light emitting diode (LED) 600 is illustrated. The LED 600 includes an insulating substrate 610, a light emitting structure 620 formed on the insulating substrate 610, an N-electrode 630 and a P-electrode 640. The light emitting structure 620 includes an N-type layer 621, a P-type layer 623 and an active layer 622 sandwiched therebetween. The N-type layer 621 has an exposed portion uncovered by the active layer 622 and the P-type layer 623. The N-electrode 630 is an N-contact pad and formed on the exposed portion of the N-type layer 621. The P-electrode 640 is a P-contact pad and arranged on the P-type layer 623. The N-electrode 630 and the P-electrode 640 are diagonally arranged with each other. However, due to a relatively high resistance of the P-type layer 623, the current injected at the P-electrode 640 does not spread laterally away from the P-electrode 640 and does not spread laterally within the P-type layer 623. The current flows from the P-electrode 640 along the shortest path (i.e., usually vertically) across the active layer 622 to the N-type layer 621. As a result, an area utilization ratio of the active layer 622 is lowered and thus the light extraction efficiency of the light emitting diode 600, especially with regard to a light emitting diode with a large sized light emitting structure, is degraded.

Figure 3:
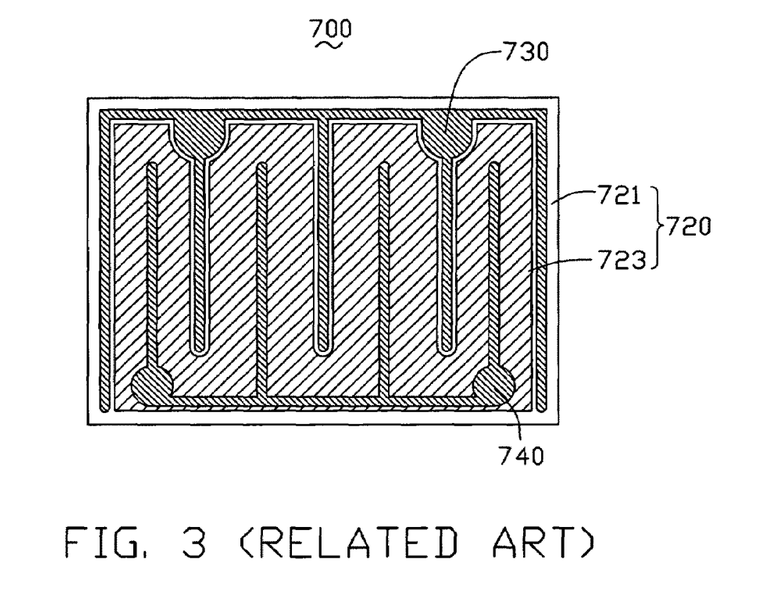
FIG. 3 is a schematic, top view of another typical light emitting diode.

Referring to FIG. 3, in order to overcome the above-mentioned issue associated with the low area utilization ratio of the active layer, an improved light emitting diode 700 is disclosed in U.S. Pat. No. 6,307,218 B1, entitled "electrode structures for light emitting devices". The light emitting diode 700 includes a light emitting structure 720 having an N-type layer 721 and a P-type layer 723, a comb-shaped N-electrode 730 and a comb-shaped P-electrode 740. The comb-shaped N-electrode 730 and P-electrode 740 are interdigitated with each other and respectively ohmic contacted with the N-type layer 721 and the P-type layer 723. The use of the comb-shaped N-electrode 730 and P-electrode 740 can macroscopically improve current spreading to some degree, but still subject to current crowding in the microscopical level of the comb-shaped P-electrode 740. Accordingly, the light extraction efficiency of the light emitting diode 700 is low.

Therefore, what is needed is a solid-state light emitting device with good current spreading and thus relatively high light extraction efficiency.

SUMMARY

A solid-state light emitting device, in accordance with a present embodiment, is provided. The solid-state light emitting device includes a substrate, a light emitting structure formed on the substrate, a first electrode and a second electrode having opposite polarities with each other. The light emitting structure includes a first-type semiconductor layer and a second-type semiconductor layer. The first electrode is electrically connected with the first-type semiconductor layer. The second electrode includes a transparent conductive layer and a metallic conductive layer. The transparent conductive layer is formed on and electrically connected with the second-type semiconductor layer. The metallic conductive layer is formed on a region of the transparent conductive layer, and any point on the region of the transparent conductive layer is no more than 300 micrometers from a nearest part of the metallic conductive layer. An exposed portion uncovered by the metallic conductive layer of the region has an area of at least 80% of a total area of the transparent conductive layer.

Due to the fact that the present solid-state light emitting device is configured with the second electrode including the transparent conductive layer and the metallic conductive layer, the transparent conductive layer having a relatively low resistance, which facilitates the lateral current spreading. Furthermore, because any point on the region of the transparent conductive layer is no more than 300 micrometers from a nearest part of the metallic conductive layer, and an exposed portion uncovered by the metallic conductive layer of the region has an area of at least 80% of a total area of the transparent conductive layer, the phenomenon of the lateral spreading current being blocked off resulting from the existence of crystal grain boundaries and crystal defects can be effectively suppressed. Accordingly, based upon the structure arrangement of the second electrode, lateral current spreading of the present solid-state light emitting device is high and thus a relatively high light extraction efficiency can be achieved.

Other advantages and novel features will become more apparent from the following detailed description of embodiments, when taken in conjunction with the accompanying drawings.

BRIEF DESCRIPTION OF THE DRAWINGS

Many aspects of the present solid-state light emitting device can be better understood with reference to the following drawings. The components in the drawings are not necessarily drawn to scale, the emphasis instead being placed upon clearly illustrating the principles of the present solid-state light emitting device. Moreover, in the drawings, like reference numerals designate corresponding parts throughout the several views.

The exemplifications set out herein illustrate various preferred embodiments, in various forms, and such exemplifications are not to be construed as limiting the scope of the present solid-state light emitting device in any manner.

DETAILED DESCRIPTION

Figure 4:
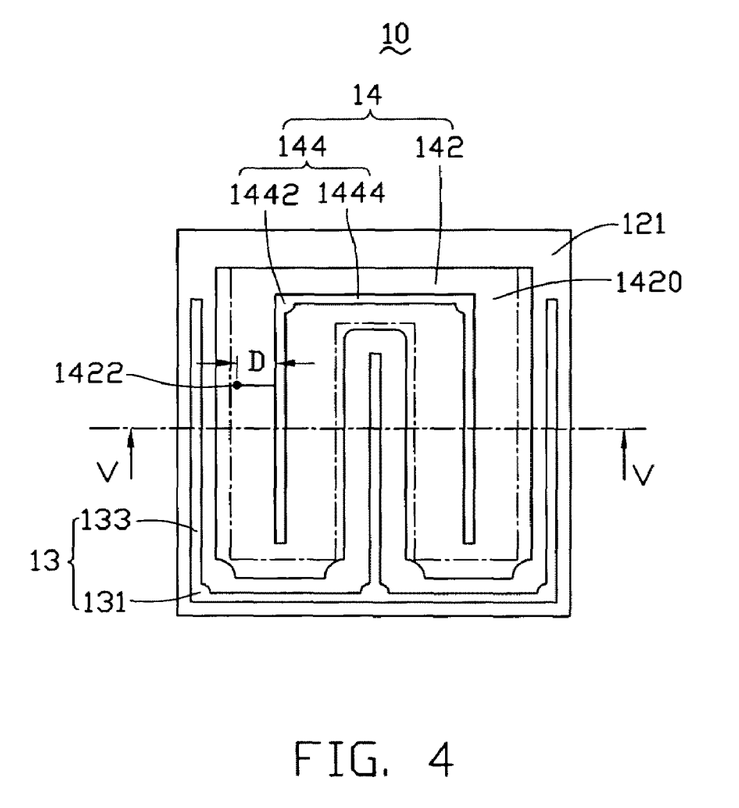
FIG. 4 is a schematic, top view of a solid-state light emitting device, in accordance with a present first embodiment.
Figure 5:
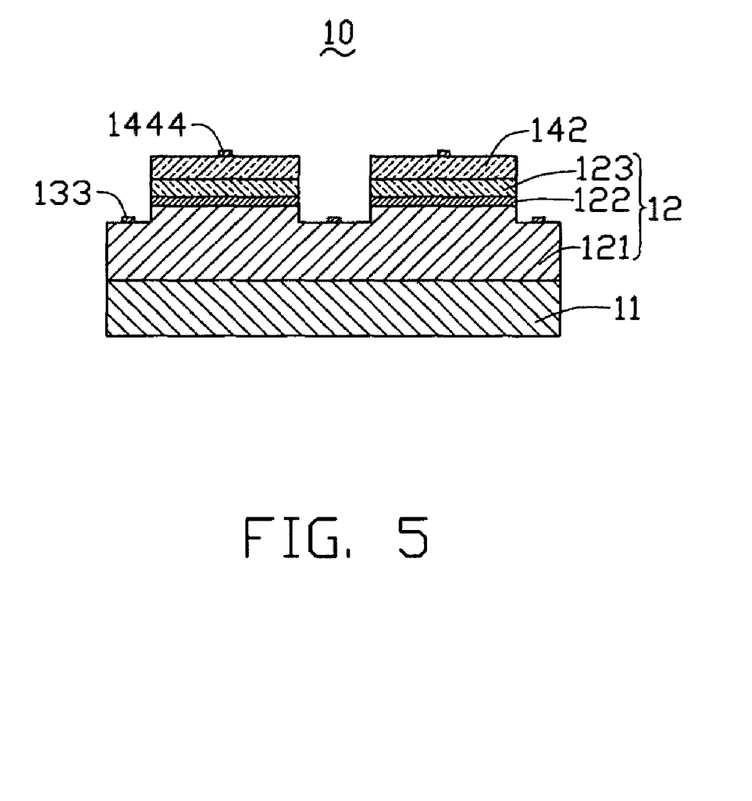
FIG. 5 is a schematic, sectional view of the solid-state light emitting device, taken along the line V-V in FIG. 4.

Referring to FIGS. 4 and 5, a solid-state light emitting device 10 such as a semiconductor light emitting diode, in accordance with a present first embodiment, is provided. The solid-state light emitting device 10 includes an insulating substrate 11, a light emitting structure 12 formed on the insulating substrate 11, a first electrode 13 and a second electrode 14 having opposite polarities with each other.

The insulating substrate 11 can be sapphire ($\alpha$-$Al_2O_3$) substrate, silicon carbide (SiC) substrate, etc.

The light emitting structure 12 generally includes a first-type semiconductor layer such as N-type semiconductor layer 121, a second-type semiconductor layer such as P-type semiconductor layer 123, and an active layer 122 sandwiched between the N-type semiconductor layer 121 and the P-type semiconductor layer 123. The N-type semiconductor layer 121, the active layer 122 and the P-type semiconductor layer 123 are made of III-V or II-VI compound semiconductors. The N-type semiconductor layer 121 has an exposed portion uncovered by the active layer 122 and the P-type semiconductor layer 123. The exposed portion surrounds the active layer 122 and the P-type semiconductor 123. It is understood that the light emitting structure 12 can be consisted of an N-type semiconductor layer and a P-type semiconductor layer and thus the active layer can be omitted.

The first electrode 13 is formed (e.g., deposited) on the exposed portion of the N-type semiconductor layer 121 and electrically contacted therewith. The first electrode 13 is patterned to have a comb-like shape. The first electrode 13 includes a plurality of contact pads 131 and a plurality of extending arms 133 extending from respective corresponding contact pads 131. At least one of the contact pads 131 is configured to electrically connect to an external circuit via wire bonding. As illustrated in FIG. 4, the first electrode 13 includes three contact pads 131 and five straight strip-shaped extending arms 133. The three contact pads 131 are collinear and each of the two adjacent contact pads 131 have an extending arm 133 connected therebetween. The other three extending arms 133 extend from respective corresponding contact pads 131 along a direction substantially perpendicular to an extension direction of the extending arm 133 connected between two adjacent contact pads 131.

The second electrode 14 is formed on and in electrical contact with the P-type semiconductor layer 123. In particular, the second electrode 14 includes a transparent conductive layer 142 and a metallic conductive layer 144 electrically contacted with the transparent conductive layer 142.

The transparent conductive layer 142 is formed (e.g., deposited) on and in electrical contact with the P-type semiconductor layer 123. The transparent conductive layer 142 is light-permeable to light emitted from the light emitting structure 12. The transparent conductive layer 142 is beneficially made of a transparent and metal-doped metal oxide, such as indium-doped tin monoxide (SnO:In), tin-doped gallium oxide ($Ga_2O_3$:Sn), tin-doped silver-indium oxide ($AgInO_2$: Sn), indium-tin oxide ($In_2O_3$:Sn), zinc-doped indium oxide ($In_2O_3$:Sn), antimony-doped tin dioxide ($SnO_2$:Sb), or aluminum-doped zinc oxide (ZnO:Al).

The metallic conductive layer 144 is formed (e.g., deposited) on a region 1420 (as denoted by dotted and dashed lines of FIG. 4) of the transparent conductive layer 142 and at a side thereof facing away from the P-type semiconductor layer 123. The metallic conductive layer 144 is patterned to have a comb-like shape. The metallic conductive layer 144 is in electrical contact with the region 1420 of the transparent conductive layer 142 and generally made of an opaque metal material or metal alloy. The metallic conductive layer 144 includes a plurality of contact pads 1442 and a plurality of extending arms 1444 extending from respective corresponding contact pads 1442. At least one of the contact pads 1442 connects to an external circuit via wire bonding. As illustrated in FIG. 4, the comb-shaped metallic conductive layer 144 includes two contact pads 1442 and three straight strip-shaped extending arms 1444. The two contact pads 1442 have an extending arm 1444 connected therebetween. The other two extending arms 1444 extend from respective corresponding contact pads 1442 along a direction substantially perpendicular to a lengthwise direction of the extending arm 1444 connected between the contact pads 1442. The other two extending arms 1444 are alternately arranged with corresponding extending arms 133 of the first electrode 13.

As illustrated in FIG. 4, any point 1422 on the region 1420 has a distance D from a nearest part of the metallic conductive layer 144 no more than 300 micrometers. An exposed portion uncovered by the metallic conductive layer 144 of the region 1420 has an area of at least 80% of a total area of the transparent conductive layer 142.

Figure 6:
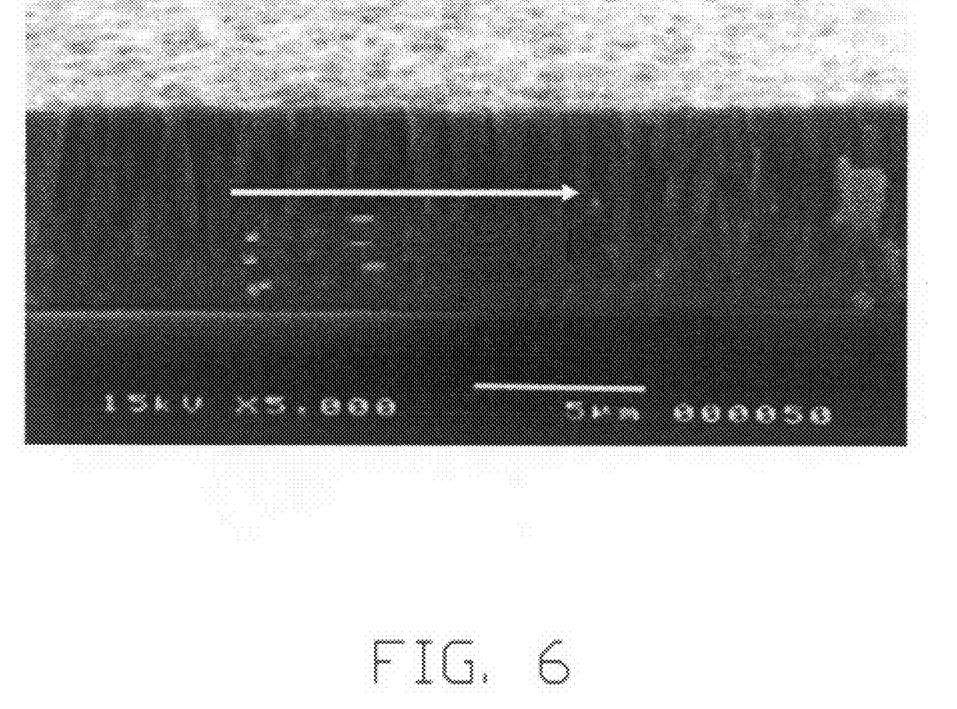
FIG. 6 is a SEM (scanning electron microscopy) photo of a transparent conductive layer of the solid-state light emitting device of FIG. 4.

As illustrated in FIG. 6, under the microscopic view, the transparent conductive layer 142 contains a number of cylindrical crystal domains thus, long-distance lateral current spreading along a direction denoted by the arrow in FIG. 6 is blocked off due to the existence of crystal boundaries and crystal defects. As such, the distance D beneficially is set to be no more than 300 micrometers so as to reduce the possibility of the lateral current spreading being blocked off. Furthermore, according to experimental results, when the area of the exposed portion uncovered by the metallic conductive layer 144 of the region 1420 is up to 80% of the total area of the transparent conductive layer 142, the solid-state light emitting device 10 readily could achieve improved light extraction efficiency. It is understood that the larger a ratio of the area of the exposed portion uncovered by the metallic conductive layer 144 of the region 1420 to the total area of the transparent conductive layer 142, the better the light extraction efficiency of the solid-state light emitting device 10.

Figure 7:
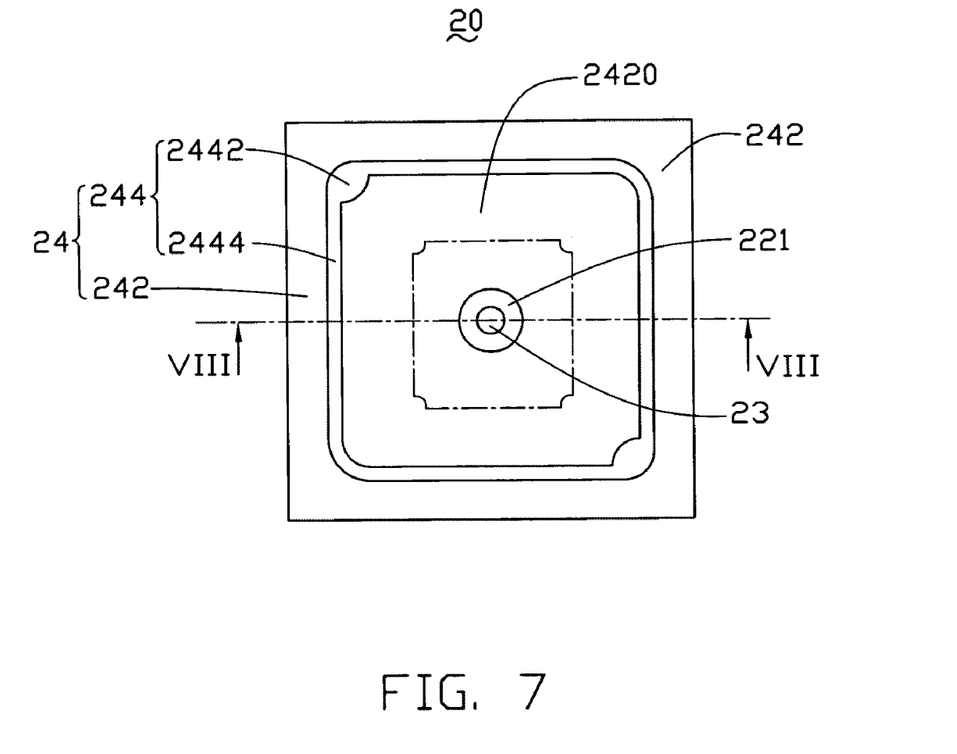
FIG. 7 is a schematic, top view of a solid-state light emitting device, in accordance with a present second embodiment.
Figure 8:
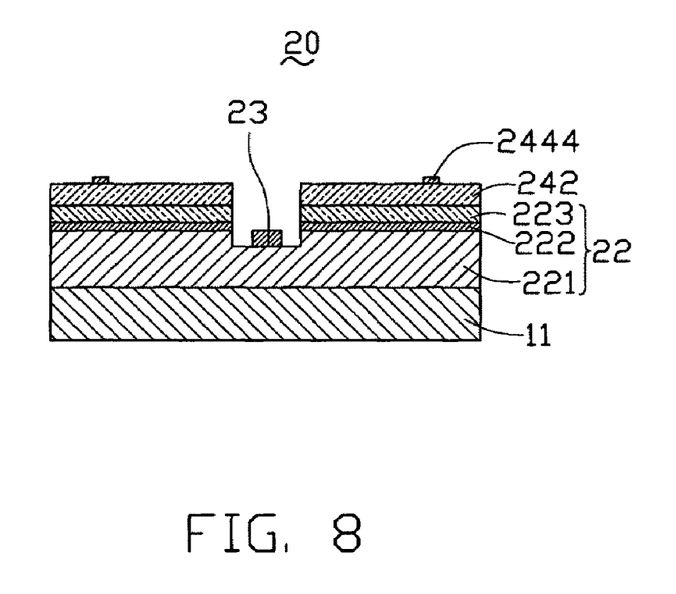
FIG. 8 is a schematic, sectional view of the solid-state light emitting device, taken along the line VIII-VIII in FIG. 7.

Referring to FIGS. 7 and 8, a solid-state light emitting device 20 such a semiconductor light emitting diode, in accordance with a present second embodiment, is provided. The solid-state light emitting device 20 of the present second embodiment is similar to that of the first present embodiment and includes an insulating substrate 11, a light emitting structure 22 formed on the insulating substrate 11, a first electrode 23 and a second electrode 24 which have opposite polarities with each other. The light emitting structure 22 includes an N-type semiconductor layer 221, a P-type semiconductor layer 223 and an active layer 222 sandwiched between the N-type semiconductor layer 221 and the P-type semiconductor layer 223. The second electrode 24 includes a transparent conductive layer 242 and a metallic conductive layer 244 formed on a region 2420 (as denoted by the dotted and dashed lines of FIG. 7) of the transparent conductive layer 242 and in electrical contact therewith. An area of the exposed portion uncovered by the metallic conductive layer 244 of the region 2420 is approximately larger than or equal to 80% of a total area of the transparent conductive layer 242. However, the position of an exposed portion of the N-type semiconductor layer 221, the shape and position of the first electrode 23 and the shapes of the transparent conductive layer 242 and the metallic conductive layer 244 of the second electrode 24 are different from that of the first embodiment.

In particular, the exposed portion (not labeled) of the N-type semiconductor layer 221 is uncovered by the active layer 222, the P-type semiconductor layer 223 and the second electrode 24 and surrounded by the active layer 222 and the P-type semiconductor layer 223. The exposed portion is located at a central portion of the N-type semiconductor layer 221 and may have a circular shape as illustrated in FIG. 7.

The first electrode 23 includes a contact pad in ohmic contact with the N-type semiconductor layer 221. The contact pad is disposed at the exposed portion of the N-type semiconductor layer 221 and may have a substantially circular shape.

The transparent conductive layer 242 is formed e.g., deposited on the P-type semiconductor layer 223 and in ohmic contact therewith. The transparent conductive layer 242 has a through hole defined at a central location thereof corresponding to the exposed portion of the N-type semiconductor layer 221 such that transparent conductive layer 242 is given a ring-shaped profile.

The metallic conductive layer 244 is formed e.g., deposited on the region 2420 of the transparent conductive layer 242. The metallic conductive layer 244 includes a plurality of contact pads 2442 and a plurality of extending arms 2444 which extend from the respective contact pads 2442. The contact pads 2442 and the extending arms 2444 cooperatively constitute a rectangular continuous/close ring-shaped structure. The first electrode 23 is substantially collinear with diagonally arranged contact pads 2442 and corresponding to the intersection point of the diagonals of the rectangular ring-shaped structure. As illustrated in FIG. 7, the metallic conductive layer 244 includes two contact pads 2442 and two L-shaped extending arms 2444. The two contact pads 2442 are arranged diagonal with each other.

Figure 9:
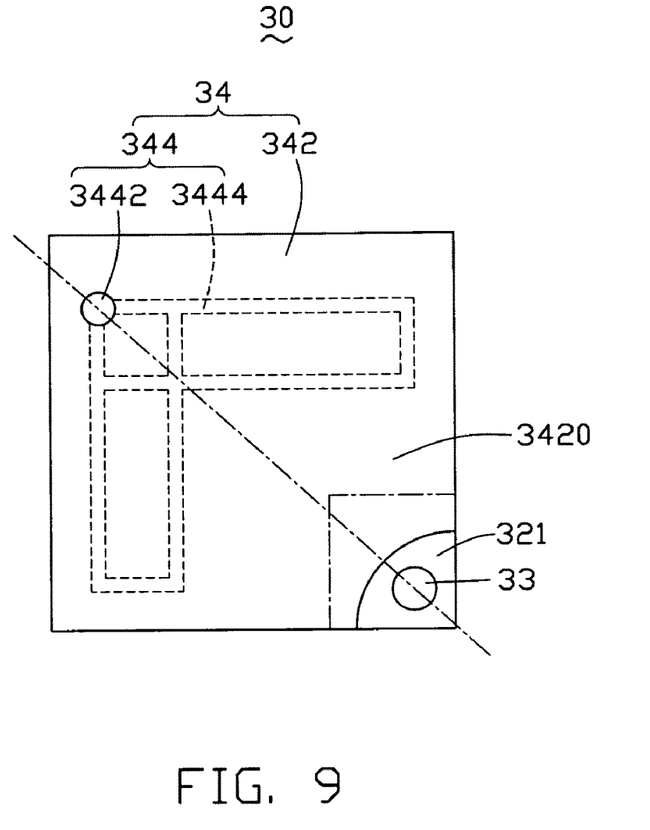
FIG. 9 is a schematic, top view of a solid-state light emitting device, in accordance with a present third embodiment.
Figure 10:
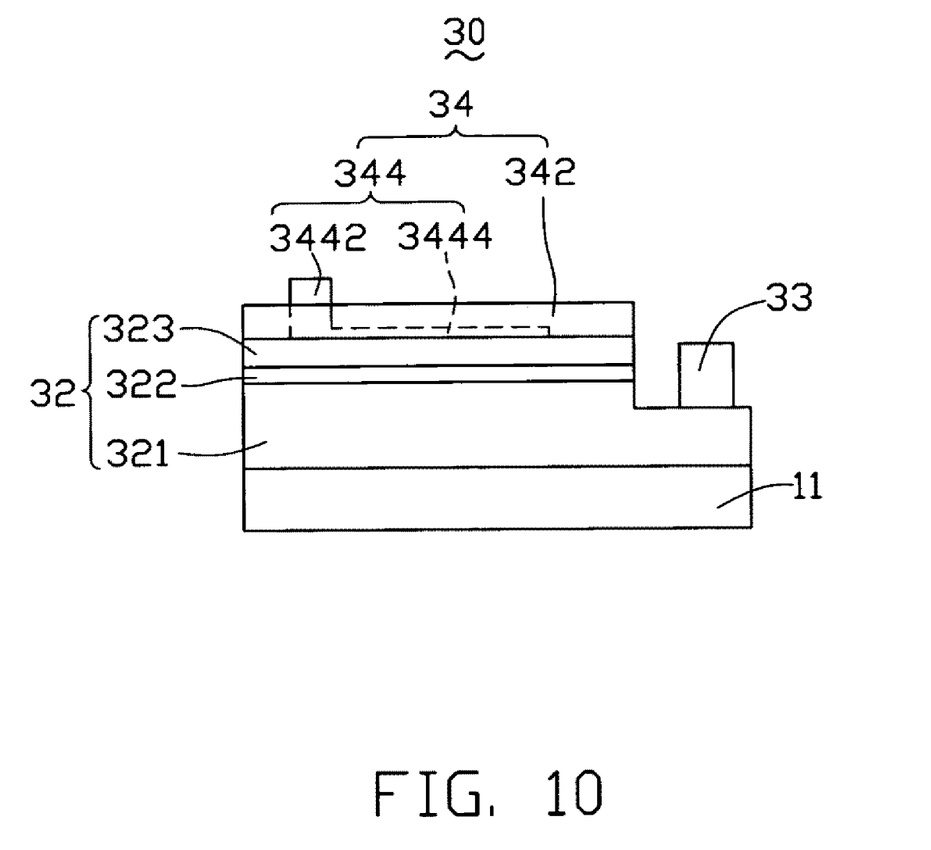
FIG. 10 is a schematic, front view of the solid-state light emitting device of FIG. 9.

Referring to FIGS. 9 and 10, a solid-state light emitting device 30 such as a semiconductor light emitting diode, in accordance with a present third embodiment, is provided. The solid-sated light emitting device 30 of the present third embodiment is similar to that of the first present embodiment and includes an insulating substrate 11, a light emitting structure 32 formed on the insulating substrate 11, a first electrode 33 and a second electrode 34 which have opposite polarities with each other. The light emitting structure 32 includes an N-type semiconductor layer 321, a P-type semiconductor layer 323 and an active layer 322 sandwiched therebetween. The second electrode 34 includes a transparent conductive layer 342 and a metallic conductive layer 344 formed on a region 3420 (as denoted by dotted and dashed lines of FIG. 9) of the transparent conductive layer 342 and in electrical contact therewith. An area of the exposed portion uncovered by the metallic conductive layer 344 of the region 3420 is approximately larger than or equal to 80% of a total area of the transparent conductive layer 342. However, the position of an exposed portion of the N-type semiconductor layer 321, the shape and position of the first electrode 33, and the shapes and relative relationship of the transparent conductive layer 342 and the metallic conductive layer 344 of the second electrode 34 are different from that of the first embodiment.

In particular, the exposed portion of the N-type semiconductor layer 321 is uncovered by the active layer 322, the P-type semiconductor layer 323 and the second electrode 34 and located at a corner of the N-type semiconductor layer 321.

The first electrode 33 includes a contact pad in ohmic contact with the N-type semiconductor layer 321. The contact pad is disposed at the exposed portion of the N-type semiconductor layer 321 and has a substantially circular shape.

The transparent conductive layer 342 is formed e.g., deposited on the P-type semiconductor layer 323 and in ohmic contact therewith. A corner of the transparent conductive layer 342 corresponding to the first electrode 33 is removed.

The metallic conductive layer 344 includes a contact pad 3442 and a plurality of extending arms 3444 which extend from the contact pad 3442. The extending arms 3444 are arranged at a side of the region 3420 of the transparent conductive layer 342 adjacent to the P-type semiconductor layer 323 and electrically contacted with the P-type semiconductor layer 323, the positional configuration of the extending arms 3444 renders a stronger adhesion force between the second electrode 34 and the P-type semiconductor layer 323. An electrical contact manner between the extending arms 3444 and the P-type semiconductor layer 323 can be in ohmic contact or schottky contact. It is indicated that the schottky contact manner between the extending arms 3444 and the P-type semiconductor layer 323 would greatly facilitate the lateral current spreading. The contact pad 3442 penetrates through the region 3420 of the transparent conductive layer 342 from a side thereof facing away from the P-type semiconductor layer 323 to connect with the extending arms 3444. As illustrated in FIG. 9, the metallic conductive layer 344 includes one contact pad 3442 and two U-shaped extending arms 3444 which extend from the contact pad 3442. The two U-shaped extending arms 3444 are crossed and mirror-symmetrical with each other with respect to an imaginary plane (as denoted by dotted and dash line in FIG. 9) where a center connection line between the contact pad 3442 and the first electrode 33 located.

Figure 11:
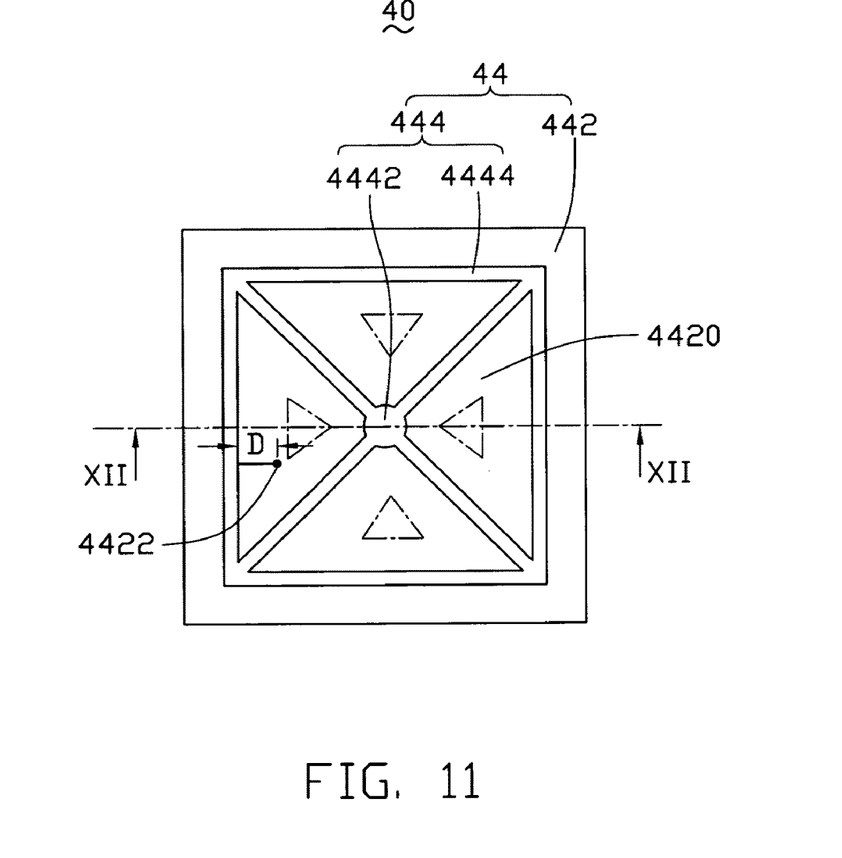
FIG. 11 is a schematic, top view of a solid-state light emitting device, in accordance with a present fourth embodiment.
Figure 12:
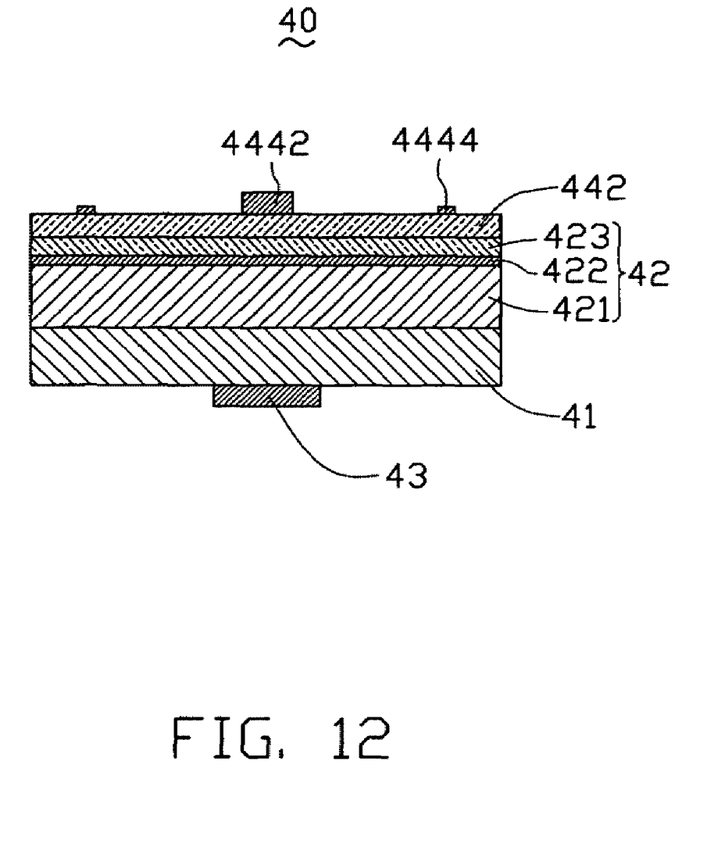
FIG. 12 is a schematic, sectional view of the solid-state light emitting device, taken along the line XII-XII in FIG. 11.

Referring to FIGS. 11 and 12, a solid-state light emitting device 40 such as a semiconductor light emitting diode, in accordance with a present fourth embodiment, is provided. The solid-state light emitting device 40 includes an electrically conductive substrate 41, a light emitting structure 42 formed on the electrically conductive substrate 41, a first electrode 43 and a second electrode 44 which have opposite polarities with each other.

The electrically conductive substrate 41 beneficially is made of a doped semiconductor material such as N-doped silicon or N-doped arsenic gallium (GaAs), or a ceramic material with an electrically conductive channel.

The light emitting structure 42 generally includes a first-type semiconductor layer such as N-type semiconductor layer 421, a second-type semiconductor layer such as P-type semiconductor layer 423, and an active layer 422 sandwiched therebetween. It is understood that the light emitting structure 42 may be consisted of an N-type semiconductor layer and a P-type semiconductor layer and thus the active layer can be omitted.

The first electrode 43 is formed on a side of the electrically conductive substrate 41 facing away from the light emitting structure 42 and may includes a contact pad.

The second electrode 44 is formed on and in electrical contact with the P-type semiconductor layer 423. The second electrode 44 includes a transparent conductive layer 442 and a metallic conductive layer 444 in electrical contact therewith.

The transparent conductive layer 442 is formed on the P-type semiconductor layer 423 and in ohmic contact therewith. The transparent conductive layer 442 is generally light-permeable to light emitted from the light emitting structure 42. The transparent conductive layer 442 is beneficially made of a transparent and metal-doped metal oxide, such as indium-doped tin monoxide (SnO:In), tin-doped gallium oxide ($Ga_2O_3$:Sn), tin-doped silver-indium oxide ($AgInO_2$:Sn), indium-tin oxide ($In_2O_3$:Sn), zinc-doped indium oxide ($In_2O_3$:Sn), antimony-doped tin dioxide ($SnO_2$:Sb), or aluminum-doped zinc oxide (ZnO:Al).

The metallic conductive layer 444 is formed on a region 4420 (as denoted by dotted and dashed lines of FIG. 11) of the transparent conductive layer 442 and at a side thereof facing away from the P-type semiconductor layer 423 to form electrical contact therewith. The metallic conductive layer 444 advantageously is made of an opaque metal material or metal alloy. As illustrated in FIG. 11, the metallic conductive layer 444 includes a contact pad 4442 and two Z-shaped extending arms 4444 which extend from the contact pad 4442. The contact pad 4442 and the two Z-shaped extending arms 4444 cooperatively form a rectangular continuous/close ring-shaped structure with two diagonals. The contact pad 4442 is located at the intersect point of the two diagonals of the rectangular ring-shaped structure. The first electrode 43 is located at a side of the electrically conductive substrate 41 facing away from the second electrode 44 and directly behind the contact pad 4442.

As illustrated in FIG. 11, any point 4422 on the region 4420 of the transparent conductive layer 442 has a distance D from a nearest part of the metallic conductive layer 444 no more than 300 micrometers. The region 4420 has an area of the exposed portion uncovered by the metallic conductive layer 444 of at least 80% of a total area of the transparent conductive layer 442. Under the microscopic view, the transparent conductive layer 142 contains a number of cylindrical crystal domains thus (see FIG. 6), long-distance lateral current spreading along a direction denoted by the arrow in FIG. 6 is blocked off due to the existence of a number of crystal boundaries and crystal defects. As such, the distance D beneficially is set to be no more than 300 micrometers so as to reduce the possibility of the lateral current spreading being blocked off. Furthermore, according to experimental results, when the area of the exposed portion uncovered by the metallic conductive layer 444 of the region 4420 is up to 80% of the total area of the transparent conductive layer 442, the solid-state light emitting device 40 readily could achieve an improved light extraction efficiency. It is understood that the larger a ratio of the area of the region 4420 to the area of the transparent conductive layer 442, the better the light extraction efficiency of the solid-state light emitting device 40.

Figure 13:
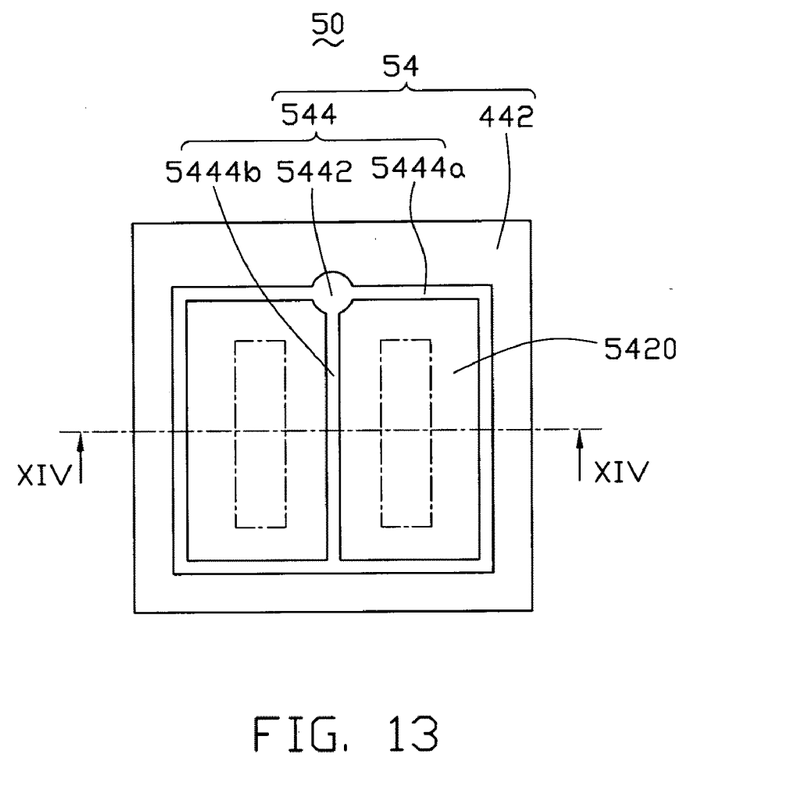
FIG. 13 is a schematic, top view of a solid-state light emitting device, in accordance with a present fifth embodiment.
Figure 14:
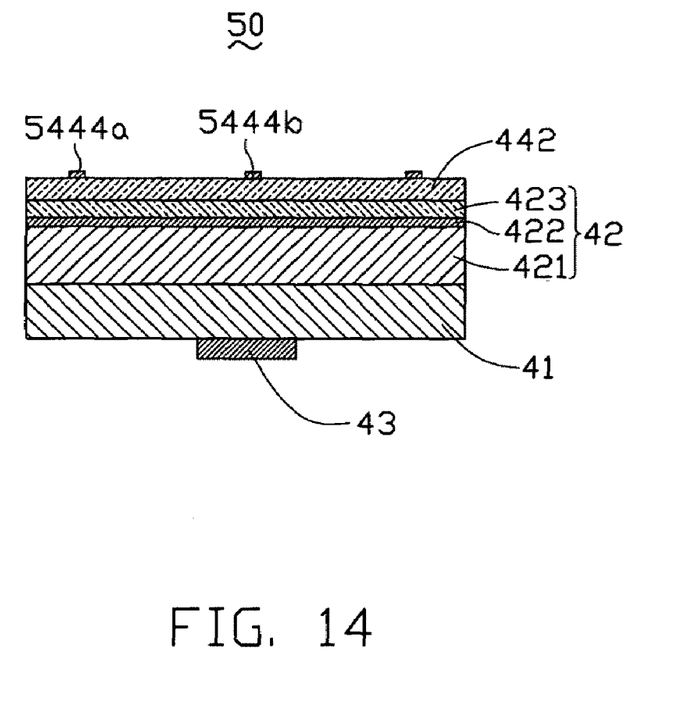
FIG. 14 is a schematic, sectional view of the solid-state light emitting device, taken along the line XIV-XIV in FIG. 13.

Referring to FIGS. 13 and 14, a solid-state light emitting device 50 such as a semiconductor light emitting diode, in accordance with a present fifth embodiment, is provided. The solid-state light emitting device 50 of the present fifth embodiment is similar to that of the present fourth embodiment and includes an electrically conductive substrate 41, a light emitting structure 42 formed on the electrically conductive substrate 41, a first electrode 43 and a second electrode 54 which have opposite polarities with each other. The second electrode 54 includes a transparent conductive layer 442 and a metallic conductive layer 544 formed on a region 5420 (as denoted by dotted and dashed lines of FIG. 13) of the transparent conductive layer 442 and in electrical contact therewith. Any point on the region 5420 is no more than 300 micrometers from a nearest part of the metallic conductive layer 544. An area of the exposed portion uncovered by the metallic conductive layer 544 of the region 5420 is approximately larger than or equal to 80% of a total area of the transparent conductive layer 442. However, the shape of the metallic conductive layer 544 is different from that of the present fourth embodiment.

In particular, as illustrated in FIG. 13, the metallic conductive layer 544 includes a contact pad 5442, two U-shaped extending arms 5444a which extend from the contact pad 5442, and a straight strip-shaped extending arm 5444b which extends from the contact pad 5442. The two U-shaped extending arms 5444a are mirror-symmetrical with each other with respect to the straight strip-shaped arm portion 5444b. As illustrated in FIG. 14, the first electrode 43 is located at a side of the electrically conductive substrate 41 facing away from the second electrode 54.

It is understood to the person skilled in the art, that the electrical contact relationship (e.g., ohmic contact or schottky contact) between the P-type semiconductor layer 323 and the metallic conductive layer 344 of the second electrode 34, in accordance with the present third embodiment, can be applied to the solid-state light emitting devices 40, 50 respectively in accordance with the present fourth and fifth embodiments.

In addition, the skilled person in the art can perform various changes within the spirit of the present invention, such as changing the material and/or shape of at least one of the metallic conductive layers 144, 244, 344, 444 and 544, changing the material and/or shape of at least one of the transparent conductive layers 142, 242, 342 and 442, and/or changing the material and/or shape of at least one of the first electrodes 13, 23, 33 and 43, etc.

It is believed that the present embodiments and their advantages will be understood from the foregoing description and it will be apparent that various changes may be made thereto without departing from the spirit and scope of the invention or sacrificing all of its material advantages, the examples hereinbefore described merely being preferred or exemplary embodiments of the present invention.

What is claimed is:

1. A solid-state light emitting device, comprising:
   a substrate;
   a light emitting structure formed on the substrate, the light emitting structure comprising a first-type semiconductor layer and a second-type semiconductor layer;
   a first electrode electrically connected with the first-type semiconductor layer; and
   a second electrode having an opposite polarity with respect to the first electrode, the second electrode comprising a transparent conductive layer formed on and electrically connected with the second-type semiconductor layer and a metallic conductive layer formed on a region of the transparent conductive layer and in electrical contact therewith, any point on the region being no more than 300 micrometers from a nearest part of the metallic conductive layer, and an exposed portion uncovered by the metallic conductive layer of the region having an area of at least 80% of a total area of the transparent conductive layer.

2. The solid-state light emitting device of claim 1, wherein the metallic conductive layer comprises a contact pad and an extending arm extending therefrom.

3. The solid-state light emitting device of claim 2, wherein the transparent conductive layer is in ohmic contact with the second-type semiconductor layer, and the metallic conductive layer is arranged at a side of the region of the transparent conductive layer facing away from the second-type semiconductor layer.

4. The solid-state light emitting device of claim 2, wherein the transparent conductive layer is in ohmic contact with the second-type semiconductor layer, the extending arm is arranged at a side of the region of the transparent conductive layer adjacent to the second-type semiconductor layer, and the contact pad penetrates through the region of the transparent conductive layer from a side of the region of the transparent conductive layer facing away from the second-type semiconductor layer to electrically connect the extending arm.

5. The solid-state light emitting device of claim 4, wherein the contact pad and the extending arm are in schottky contact with the second-type semiconductor layer.

6. The solid-state light emitting device of claim 2, wherein the extending arm is one of straight strip-shaped, L-shaped, U-shaped and Z-shaped.

7. The solid-state light emitting device of claim 6, wherein the metallic conductive layer comprises two contact pads and two extending arms extending from the two contact pads, the two contact pads and the two extending arms cooperatively constitute a substantially rectangular continuous ring-shaped structure, the first-type semiconductor layer has an exposed portion located at a side thereof facing away from the substrate and uncovered by the second-type semiconductor layer, the first electrode is arranged at the exposed portion and surrounded by the ring-shaped structure.

8. The solid-state light emitting device of claim 1, wherein the substrate is an insulating substrate, the first-type semiconductor layer has an exposed portion located at a side thereof facing away from the insulating substrate, the first electrode is arranged at the exposed portion and in ohmic contact with the first-type semiconductor layer.

9. The solid-state light emitting device of claim 1, wherein the substrate is an electrically conductive substrate, and the first electrode is arranged at a side of the electrically conductive substrate facing away from the first-type semiconductor layer to electrically connect with the first-type semiconductor layer.

10. The solid-state light emitting device of claim 1, wherein the first-type semiconductor layer and the second-type semiconductor layer respectively are an N-type semiconductor layer and a P-type semiconductor layer.

11. The solid-state light emitting device of claim 1, wherein the transparent conductive layer is made of a transparent and metal-doped metal oxide.

12. The solid-state light emitting device of claim 11, wherein the metal-doped metal oxide is selected from the group consisting of indium-doped tin monoxide, tin-doped gallium oxide, tin-doped silver-indium oxide, indium-tin oxide, zinc-doped indium oxide, antimony-doped tin dioxide and aluminum-doped zinc oxide.

13. A solid-state light emitting device, comprising:
a substrate;
a light emitting structure formed on the substrate and comprising a first-type semiconductor layer, a second-type semiconductor layer and an active layer sandwiched therebetween;
a first electrode electrically connected with the first-type semiconductor layer; and
a second electrode having an opposite polarity with respect to the first electrode and electrically connected with the second-type semiconductor layer;
wherein the second electrode comprises a light-permeable conductive layer and an opaque conductive layer in electrical contact with the light-permeable conductive layer, the opaque conductive layer formed on a region of the light-permeable conductive layer, any point on the region being no more than 300 micrometers from a nearest part of the opaque conductive layer, and an exposed portion uncovered by the opaque conductive layer of the region having an area of at least 80% of a total area of the light-permeable conductive layer.

14. The solid-state light emitting device of claim 13, wherein the opaque conductive layer is made of a metal material or a metal alloy.

* * * * *